US007549724B2

(12) United States Patent
Silverbrook

(10) Patent No.: US 7,549,724 B2
(45) Date of Patent: Jun. 23, 2009

(54) PRINTHEAD ASSEMBLY WITH MULTI-LAYERED SUPPORT STRUCTURE

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 283 days.

(21) Appl. No.: 11/540,575

(22) Filed: Oct. 2, 2006

(65) Prior Publication Data

US 2007/0024666 A1 Feb. 1, 2007

Related U.S. Application Data

(63) Continuation of application No. 11/330,056, filed on Jan. 12, 2006, now Pat. No. 7,133,799, which is a continuation of application No. 11/144,814, filed on Jun. 6, 2005, now Pat. No. 7,010,456, which is a continuation of application No. 10/713,064, filed on Nov. 17, 2003, now Pat. No. 7,048,352, which is a continuation of application No. 10/129,503, filed as application No. PCT/AU01/00239 on Mar. 6, 2001, now Pat. No. 6,676,245.

(51) Int. Cl.

| | |
|---|---|
| ***B41J 2/015*** | (2006.01) |
| ***B41J 2/155*** | (2006.01) |
| ***B41J 2/14*** | (2006.01) |
| ***B41J 2/16*** | (2006.01) |
| ***B41J 2/05*** | (2006.01) |
| ***B32B 9/00*** | (2006.01) |
| ***B32B 3/28*** | (2006.01) |
| ***B32B 15/00*** | (2006.01) |
| ***H05K 1/00*** | (2006.01) |

(52) U.S. Cl. ............................ 347/42; 347/20; 347/49; 347/50; 347/63; 428/318.4; 428/181; 428/678; 174/258

(58) Field of Classification Search .................. 347/18, 347/20, 40, 47, 49, 54, 59, 68, 85, 102
See application file for complete search history.

(56) References Cited

U.S. PATENT DOCUMENTS 5,528,272 A * 6/1996 Quinn et al. .................. 347/42

(Continued)

FOREIGN PATENT DOCUMENTS

EP 0841166 A 5/1998

(Continued)

OTHER PUBLICATIONS

Charmchi et al, "A BiCMOS Thermal Head Intelligent Driver with Density Controllers for Full-Tone Redition Printers", Apr. 1988, IEEE Article, vol. 23, No. 2, pp. 437-441.

(Continued)

*Primary Examiner*—Stephen D Meier
*Assistant Examiner*—Alexander C Witkowski

(57) ABSTRACT

A printhead assembly includes a printhead. The printhead includes a carrier which carries an integrated circuit (IC) configured to eject ink. The carrier defines a plurality of ink passages each in fluid communication with the IC. An elongate support supports the printhead and defines a plurality of ink chambers each in fluid communication with a respective ink passage. The support includes a core which defines the ink chambers and a multi-layered metal shell in which the core is received.

8 Claims, 1 Drawing Sheet

U.S. PATENT DOCUMENTS

| | | | | |
|---|---|---|---|---|
| 5,830,565 | A * | 11/1998 | Budnaitis | 428/318.4 |
| 5,847,327 | A * | 12/1998 | Fischer et al. | 174/258 |
| 6,270,196 | B1 | 8/2001 | Uno et al. | |
| 6,676,245 | B2 | 1/2004 | Silverbrook | |

FOREIGN PATENT DOCUMENTS

| | | | |
|---|---|---|---|
| JP | 06-087213 | A | 3/1994 |
| JP | 6087213 | A | 3/1994 |
| JP | 10157105 | A | 6/1998 |
| JP | 11-010861 | A | 1/1999 |
| JP | 99-11010861 | A | 1/1999 |
| JP | 2000-263768 | A | 9/2000 |

OTHER PUBLICATIONS

Tsumura et al. 'Thermal Characteristics of DOT-MATRIX Print Heads', 1988, IEEE Article, pp. 132-136.

Aden et al., "The Third Generation HP Thermal Ink Jet Printhead", Feb. 1994, HP Journal Publication, pp. 41-45.

Diepold et al., "A Micro-machined continuous ink jet printhead for high resolution printing", 1998, IOP Publication, No. 8, pp. 144-147.

* cited by examiner

PRINTHEAD ASSEMBLY WITH MULTI-LAYERED SUPPORT STRUCTURE

CROSS REFERENCE TO RELATED APPLICATION

The present application is a continuation of U.S. application Ser. No. 11/330,056 filed on Jan. 12, 2006, which is a continuation of U.S. application Ser. No. 11/144,814 filed on Jun. 6, 2005, now issued as U.S. Pat. No. 7,010,456, which is a continuation of U.S. application Ser. No. 10/713,064 filed on Nov. 17, 2003, now issued as U.S. Pat. No. 7,048,352 which is a continuation of U.S. application Ser. No. 10/129,503 filed on May 6, 2002, now issued as U.S. Pat. No. 6,676,245, which is a 371 of PCT/AU01/00239 filed on Mar. 6, 2001, the entire contents of which are herein incorporated by reference.

CO-PENDING APPLICATIONS

Various methods, systems and apparatus relating to the present invention are disclosed in the following co-pending applications filed by the applicant or assignee of the present invention on 24 May 2000:

PCT/AU00/00578 PCT/AU00/00579 PCT/AU00/00581 PCT/AU00/00580 PCT/AU00/00582 PCT/AU00/00587 PCT/AU00/00588 PCT/AU00/00589 PCT/AU00/00583 PCT/AU00/00593 PCT/AU00/00590 PCT/AU00/00591 PCT/AU00/00592 PCT/AU00/00584 PCT/AU00/00585 PCT/AU00/00586 PCT/AU00/00594 PCT/AU00/00595 PCT/AU00/00596 PCT/AU00/00597 PCT/AU00/00598 PCT/AU00/00516 PCT/AU00/00517 PCT/AU00/00511

Various methods, systems and apparatus relating to the present invention are disclosed in the following co-pending application, PCT/AU00/01445 filed by the applicant or assignee of the present invention on 27 Nov. 2000. The disclosures of these co-pending applications are incorporated herein by cross-reference. Also incorporated by cross-reference, is the disclosure of a co-filed PCT application, PCT/AU01/00238 (deriving priority from Australian Provisional Patent Application No. PQ6059).

FIELD OF THE INVENTION

The present invention relates to printers, and in particular to digital inkjet printers.

BACKGROUND OF THE INVENTION

Recently, inkjet printers have been developed which use printheads manufactured by micro-electro mechanical system(s) (MEMS) techniques. Such printheads have arrays of microscopic ink ejector nozzles formed in a silicon chip using MEMS manufacturing techniques.

Printheads of this type are well suited for use in pagewidth printers. Pagewidth printers have stationary printheads that extend the width of the page to increase printing speeds. Pagewidth printheads do not traverse back and forth across the page like conventional inkjet printheads, which allows the paper to be fed past the printhead more quickly.

To reduce production and operating costs, the printheads are made up of separate printhead modules mounted adjacent each other on a support beam in the printer. To ensure that there are no gaps or overlaps in the printing produced by adjacent printhead modules it is necessary to accurately align the modules after they have been mounted to the support beam. Once aligned, the printing from each module precisely abuts the printing from adjacent modules.

Unfortunately, the alignment of the printhead modules at ambient temperature will change when the support beam expands as it heats up during printhead operation. Furthermore, if the printhead modules are accurately aligned when the support beam is at the equilibrium operating temperature, there may be unacceptable misalignments in any printing before the beam has reached the operating temperature. Even if the printhead is not modularized, thereby making the alignment problem irrelevant, the support beam and printhead may bow because of different thermal expansion characteristics. Bowing across the lateral dimension of the support beam does little to affect the operation of the printhead. However, as the length of the beam is its major dimension, longitudinal bowing is more significant and can affect print quality.

SUMMARY OF THE INVENTION

Accordingly, the present invention provides a printhead assembly for a digital inkjet printer, the printhead assembly including:

a support member for attachment to the printer;

a printhead adapted for mounting to the support member;

the support member having an outer shell and a core element defining at least one ink reservoir such that the effective coefficient of thermal expansion of the support member is substantially equal to the coefficient of thermal expansion of the printhead.

Preferably, the outer shell is formed from at least two different metals laminated together and the printhead includes a silicon MEMS chip. In a further preferred form, the support member is a beam and the core element is a plastic extrusion defining four separate ink reservoirs. In a particularly preferred form, the metallic outer shell has an odd number of longitudinally extending layers of at least two different metals, wherein layers of the same metal are symmetrically disposed about the central layer.

It will be appreciated that by laminating layers of uniform thickness of the same material on opposite sides of the central layer, and at equal distances therefrom, there is no tendency for the shell to bow because of a dominating effect from any of the layers. However, if desired, bowing can also be eliminated by careful design of the shells cross section and variation of the individual layer thicknesses.

In some embodiments, the printhead is a plurality of printhead modules positioned end to end along the beam.

BRIEF DESCRIPTION OF THE DRAWING

A preferred embodiment of the invention will now be described, by way of example only, with reference to the accompanying drawing in which.

DETAILED DESCRIPTION OF THE PREFERRED EMBODIMENTS

Figure 1:
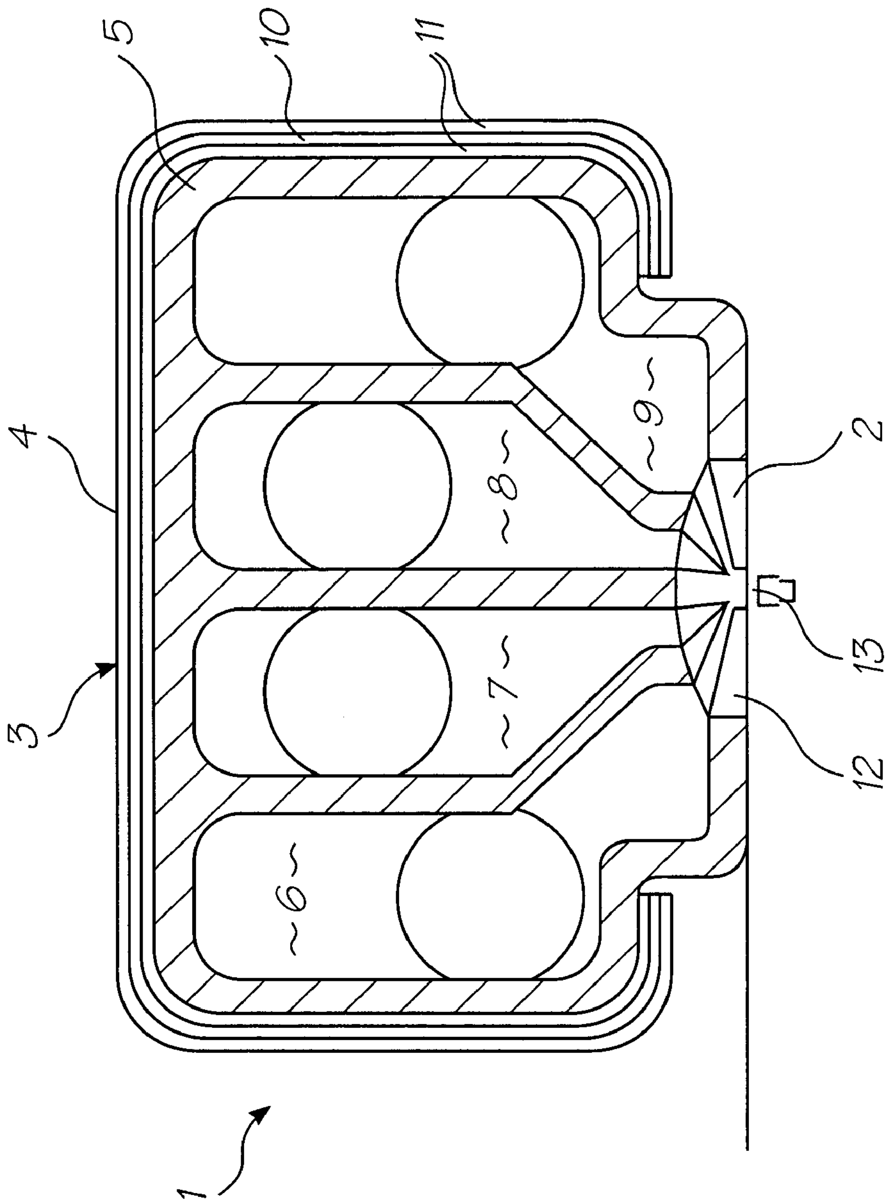
FIG. 1 is a schematic cross section of a printhead assembly according to the present invention.

Referring to the figure, the printhead assembly 1 includes a printhead 2 mounted to a support member 3. The support member 3 has an outer shell 4 and a core element 5 defining four separate ink reservoirs 6, 7, 8 and 9. The outer shell 4 is a hot rolled trilayer laminate of two different metals. The first metal layer 10 is sandwiched between layers of the second metal 11. The metals forming the trilayer shell are selected such that the effective coefficient of thermal expansion of the shell as a whole is substantially equal to that of silicon even though the coefficients of the core and the individual metals may significantly differ from that of silicon. Provided that the core or one of the metals has a coefficient of thermal expansion greater than that of silicon, and another has a coefficient less than that of silicon, the effective coefficient can be made to match that of silicon by using different layer thicknesses in the laminate.

Typically, the outer layers 11 are made of invar which has a coefficient of thermal expansion of $1.3\times10^{-6}$ m/° C. The coefficient of thermal expansion of silicon is about $2.5\times10^{-6}$ m/° C. and therefore the central layer must have a coefficient greater than this to give the support beam an overall effective coefficient substantially the same as silicon.

The printhead 2 includes a micro moulding 12 that is bonded to the core element 5. A silicon printhead chip 13 constructed using MEMS techniques provides the ink nozzles, chambers and actuators.

As the effective coefficient of thermal expansion of the support beam is substantially equal to that of the silicon printhead chip, the distortions in the printhead assembly will be minimized as it heats up to operational temperature. Accordingly, if the assembly includes a plurality of aligned printhead modules, the alignment between modules will not change significantly. Furthermore, as the laminated structure of the outer shell is symmetrical in the sense that different metals are symmetrically disposed around a central layer, there is no tendency of the shell to bow because of greater expansion or contraction of any one metal in the laminar structure. Of course, a non-symmetrical laminar structure could also be prevented from bowing by careful design of the lateral cross section of the shell.

The invention has been described herein by way of example only. Skilled workers in this field will readily recognise that the invention may be embodied in many other forms.

The invention claimed is:

1. A printhead assembly comprising:

a printhead comprising a carrier which carries a integrated circuit (IC) configured to eject ink, the carrier defining a plurality of ink passages each in fluid communication with the IC; and an elongate support which supports the printhead and defines a plurality of ink chambers each in fluid communication with a respective ink passage, the support comprising a core which defines the ink chambers and a multi-layered metal shell in which the core is received.

2. A printhead assembly as claimed in claim 1, wherein the shell comprises a triplet of metal layers which together give the shell a coefficient of thermal expansion which is comparable to that of silicon material.

3. A printhead assembly as claimed in claim 2, wherein one of the layers has a first co-efficient of thermal expansion and is located between a pair of layers each having a second co-efficient of thermal expansion.

4. A printhead assembly as claimed in claim 3, wherein the first co-efficient of thermal expansion is greater than the second co-efficient of thermal expansion.

5. A printhead assembly as claimed in claim 4, wherein the second co-efficient of thermal expansion is about $1.3\times10-6$ m/° C.

6. A printhead assembly as claimed in claim 4, wherein the first co-efficient of thermal expansion exceeds $2.5\times10-6$ m/° C.

7. A printhead assembly as claimed in claim 1, wherein the carrier is a micro molding.

8. A printhead assembly as claimed in claim 1, wherein the core is molded from plastics material.

* * * * *